(12) United States Patent
Murai et al.

(10) Patent No.: US 8,656,581 B2
(45) Date of Patent: Feb. 25, 2014

(54) METHOD OF FABRICATING A CIRCUIT APPARATUS

(75) Inventors: Makoto Murai, Gifu (JP); Yasuhiro Kohara, Gifu (JP); Ryosuke Usui, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 720 days.

(21) Appl. No.: 12/563,849

(22) Filed: Sep. 21, 2009

(65) Prior Publication Data

US 2010/0005653 A1    Jan. 14, 2010

Related U.S. Application Data

(62) Division of application No. 11/740,669, filed on Apr. 26, 2007, now Pat. No. 7,612,445.

(30) Foreign Application Priority Data

Apr. 27, 2006  (JP) .................................. 2006-122954
Apr. 16, 2007  (JP) .................................. 2007-107649

(51) Int. Cl.
*H05K 3/36*           (2006.01)

(52) U.S. Cl.
USPC .................. 29/830; 29/831; 29/846; 29/847; 29/884; 257/696

(58) Field of Classification Search
USPC .................. 29/825–830, 846–852, 882–884; 257/696, 787, 729; 174/255, 262, 264
See application file for complete search history.

(56) References Cited

U.S. PATENT DOCUMENTS

| 6,060,774 | A | | 5/2000 | Terui | |
| 6,127,633 | A | * | 10/2000 | Kinoshita | ..................... 174/259 |
| 6,286,207 | B1 | | 9/2001 | Oura et al. | |
| 6,613,987 | B2 | | 9/2003 | Seki et al. | |
| 6,905,951 | B2 | * | 6/2005 | Yoneda et al. | ................. 438/611 |
| 7,030,500 | B2 | * | 4/2006 | Shin et al. | ...................... 257/774 |
| 7,446,384 | B2 | * | 11/2008 | Paik et al. | ...................... 257/431 |
| 7,612,445 | B2 | * | 11/2009 | Murai et al. | ................... 257/696 |

(Continued)

FOREIGN PATENT DOCUMENTS

| CN | 1377219 A | 10/2002 |
| JP | 06-224325 | 8/1994 |

(Continued)

OTHER PUBLICATIONS

Chinese Office action mailed in Chinese patent application No. 200710101878.4 on Oct. 16, 2009, and English-language translation thereof.

(Continued)

*Primary Examiner* — Minh Trinh
(74) *Attorney, Agent, or Firm* — Fish & Richardson P.C.

(57) ABSTRACT

A method for fabricating a circuit apparatus includes forming a wiring layer, a conductive layer, and a first insulating layer on the wiring substrate, removing the conductive layer in an opening of the first insulating layer so as to expose the wiring layer, forming a gold plating layer on the wiring layer, removing the first insulating layer and the conductive layer, forming a second insulating layer on the wiring substrate, the second insulating layer having an opening through which the gold plating and adjacent wiring layers are exposed, and electrically connecting a circuit element to the gold plating layer.

2 Claims, 19 Drawing Sheets

(56) References Cited

U.S. PATENT DOCUMENTS

2006/0016779 A1 1/2006 Miyagawa et al.
2008/0116079 A1 5/2008 Miyagawa et al.
2010/0005653 A1* 1/2010 Murai et al. .................... 29/846

FOREIGN PATENT DOCUMENTS

| JP | 09-069586 | 3/1997 |
|----|-----------|--------|
| JP | 2002-280488 | 9/2002 |
| JP | 2005-19648 | 7/2005 |
| JP | 2005-197648 | 7/2005 |
| KR | 2000-10953 | 2/2000 |
| WO | WO 98/43289 | 10/1998 |

OTHER PUBLICATIONS

Korean Office action mailed in Korean patent application No. 10-2007-0040988 on Nov. 30, 2010, and English-language translation thereof.

* cited by examiner

METHOD OF FABRICATING A CIRCUIT APPARATUS

CROSS-REFERENCE TO RELATED APPLICATIONS

This application is a divisional of Ser. No. 11/740,669, now U.S. Pat. No. 7,612,445, filed Apr. 26, 2007, which in turn claims the benefit of priority from the prior Japanese Patent Application No. 2006-122954, filed Apr. 27, 2006, and Japanese Patent Application No. 2007-107649, filed Apr. 16, 2007, the entire contents of which are incorporated herein by reference.

BACKGROUND OF THE INVENTION

1. Field of the Invention

The present invention relates to a circuit apparatus and, more particularly, to a circuit apparatus provided with an electrode pad.

2. Description of the Related Art

With portable electronic appliances such as cell phones, PDAs, DVCs and DSCs becoming more and more advanced in their capabilities, miniaturization and weight reduction of products have become essential for market acceptance. Accordingly, highly-integrated system LSIs for achieving these goals are demanded. Since ease and convenience of use are required of these electronic appliances at the same time, high capabilities and high performance are essential requirements for LSIs used in these appliances. While the number of I/Os is increasing as a result of increasingly high integration of LSI chips, there is also a persistent requirement for miniaturization of packages themselves. In order to meet the requirements for high integration and miniaturization, development of a semiconductor package adapted for high-density packaging of semiconductor components on a substrate is called for. A packaging technology called chip size packaging (CSP) has been developed in a variety of forms to address these requirements.

Ball grid array (BGA) is known as an example of package adapted for such requirements. A BGA is formed such that semiconductor chips are mounted on a package substrate and then molded by resin. Solder balls are formed as terminals for connection to external apparatuses in selected areas on the opposite side.

FIG. 18 is a schematic sectional view of a semiconductor apparatus of BGA type according to the related art. The semiconductor apparatus (circuit apparatus) is configured such that a semiconductor element (circuit element) 106 is mounted on one surface of a circuit substrate 110 and solder balls 112 as terminals for connection to external apparatuses are bonded to the other surface. A wiring pattern 103 (pad electrode par 103a) for electrical connection with the semiconductor element 106 is provided on one surface of the circuit substrate 110. A land part 103b for bonding the terminal for connection to an external apparatus is provided on the other surface of the circuit substrate 110. Electrical connection between the wiring pattern 103 and the land part 103b is established via a conductor part provided on the interior wall of a through hole 111 running through an insulating substrate 101. A solder resist 105 protects the surface of the circuit substrate 110. One surface of the circuit substrate 110 is encapsulated by a sealing resin layer 108 after the semiconductor 106 is mounted.

FIG. 19 is a sectional view showing a pad electrode part (cross section indicated by X in FIG. 18) of the semiconductor apparatus shown in FIG. 18 on an enlarged scale. The pad electrode part 103a wire bonded to the semiconductor element 106 comprises a wiring part formed of copper and a gold plating layer 104 covering the surface of the wiring part. The solder resist layer 105 covers the copper wiring part in the pad electrode part 103a and also covers a portion of the gold plating layer 104. An opening in the solder resist 105 is encapsulated by the sealing resin 108 along with the semiconductor element 106 after the semiconductor element 106 is mounted and wire bonded.

As described in the document, it is important to ensure intimate contact (prevent exfoliation) between the pad electrode part 103a and the sealing resin layer 108 as the semiconductor element 106 is encapsulated by the sealing resin layer 108. If the intimacy of contact in the above-mentioned location is improper, the semiconductor apparatus (circuit apparatus) is affected by thermal stress and humidity, resulting in reduced reliability of the apparatus.

SUMMARY OF THE INVENTION

In this background, a general purpose of the present invention is to reduce the likelihood of exfoliation of a sealing resin layer at a pad electrode part and to improve the reliability of the circuit apparatus.

The circuit apparatus according to at least one embodiment of the present invention comprises: an electrode comprising a copper wiring layer and a gold plating layer formed in a part of the wiring layer surface which is used for electrical connection; and a sealing resin layer which covers the entirety of the electrode, wherein the sealing resin layer is in contact with the gold plating layer and the wiring layer. The term electrode refers to a pad electrode provided in a circuit substrate such as a package substrate or a module substrate, or a pad electrode provided in a circuit element a typical example of which is an LSI chip. The electrode is used to connect the circuit substrate with the circuit element such as an LSI chip by wire bonding or to connect the circuit substrate with an external circuit apparatus by wire bonding.

According to this embodiment, the sealing resin layer at the electrode is not only in contact with the gold plating layer but also in contact with the wiring layer, which provides more intimate contact than the gold plating layer. Thus, the intimacy of contact with the sealing resin layer at the electrode is improved as compared with the related-art where the sealing resin layer is only in contact with the gold plating layer. Consequently, the circuit apparatus is less affected by thermal stress and humidity, resulting in improved reliability of the apparatus.

It is preferable that a conductive member be provided to electrically connect the circuit element and an area in the pad electrode where the gold plating layer is formed. The conductive member is preferably connected electrically to the wiring layer via the gold plating layer. In this case, degradation on the surface of the pad electrode occurring if the wiring layer is formed of copper is minimized since the gold plating layer is provided on the surface of the pad electrode. Thus, the intimacy of contact between the pad electrode and the sealing resin layer is improved and, further, improper connection between the circuit element and the wiring layer in the circuit apparatus is minimized. As a result, the reliability of the circuit apparatus is further improved.

The circuit apparatus according to at least one other embodiment of the present invention comprises: a substrate; a copper wiring layer formed on the substrate; an insulating resin layer formed on the substrate and the wiring layer and having an opening in an area where an electrode is formed; a gold plating layer formed in a part of the wiring layer surface which is provided in the opening and is used for electrical connection; a circuit element provided on the substrate; a conductive member which electrically connects the circuit element and the wiring layer via the gold plating layer; and a sealing resin layer formed on the insulating resin layer and encapsulating the circuit element and the area where the electrode is formed, wherein the sealing resin layer is in contact with the gold plating layer and the wiring layer.

According to this embodiment, the sealing resin layer, which encapsulates the area in which the electrode is formed, is not only in contact with the gold plating layer but also in contact with the wiring layer, which provides more intimate contact than the gold plating layer. Thus, the intimacy of contact with the sealing resin layer, which encapsulates the area in which the electrode is formed, is improved as compared with the related-art case where the sealing resin layer is only in contact with the gold plating layer. Consequently, the circuit apparatus is less affected by thermal stress and humidity, resulting in improved reliability of the apparatus.

The circuit element may be a semiconductor element. Examples of a semiconductor element include an IC and an LSI. In this case, the semiconductor element may be wire bonded using a conductive member. Alternatively, the semiconductor element may be flip chip connected using a conductive member. The circuit element may be a passive element. Examples of a passive element include a resistor and a capacitor.

The surface of the wiring layer in contact with the sealing resin layer is preferably roughened. With this, the intimacy of contact at the interface between the wiring layer and the sealing resin layer is further improved and the likelihood of exfoliation of the sealing resin layer at the electrode is effectively reduced.

The area where the sealing resin layer is in contact with the wiring layer may be provided around the area where the sealing resin layer is in contact with the gold plating layer. In this case, the gold plating layer is surrounded by the wiring layer which is roughened so that the likelihood of exfoliation of the sealing resin layer from the pad electrode is more effectively reduced.

The present invention according to at least one other embodiment relates to a method for fabricating a circuit apparatus. The method for fabricating a circuit apparatus comprises: forming a wiring layer on the primary surface of a wiring substrate; forming a conductive layer on the entirety of the primary surface of the wiring substrate; forming a first insulating layer on the entirety of the primary surface of the wiring substrate, the first insulating layer having an opening larger than an electrode in an area where the electrode is formed; removing the conductive layer exposed in the opening so as to expose the wiring layer; forming a gold plating layer on the exposed wiring layer by using the conductive layer as a wire for plating; removing the first insulating layer and the conductive layer; forming a second insulating layer on the entirety of the primary surface of the wiring substrate, the second insulating layer having an opening through which the gold plating layer and the adjacent wiring layer are exposed; and electrically connecting a circuit element to the gold plating layer.

According to this embodiment, the conductive layer formed on the wiring layer is used as a bus line, and the conductive layer is removed after the gold plating layer is formed. Therefore, it is ensured that the bus line for plating does not represent a source of noise.

Since the conductive layer for plating is removed after the gold plating layer is formed, there are less constraints on the layout of wiring etc. Accordingly, high density of components in the circuit apparatus is achieved.

In removing the first insulating layer and the conductive layer in the method for fabricating the circuit apparatus according to this embodiment, the exposed surface of the wiring layer may be roughened.

It is to be noted that any arbitrary combination or rearrangement of the above-described structural components and so forth are all effective as and encompassed by the present embodiments. Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 7A-7D are sectional views along A-A' of FIGS. 6A-6D;

FIGS. 9A-9B are sectional views along A-A' of FIGS. 8A-8B;

DETAILED DESCRIPTION OF THE INVENTION

The invention will now be described by reference to the preferred embodiments. This does not intend to limit the scope of the present invention, but to exemplify the invention.

A description will be given below of embodiments of the present invention with reference to the drawings. In the figures, like numerals represent like constituting elements, and the description thereof is omitted appropriately.

First Embodiment

Figure 1:
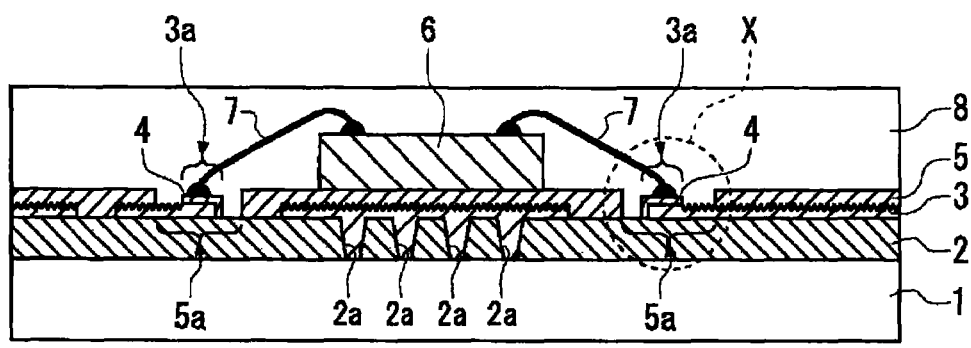
FIG. 1 is a sectional view showing the schematic sectional structure of a circuit apparatus according to a first embodiment of the present invention.
Figure 2:
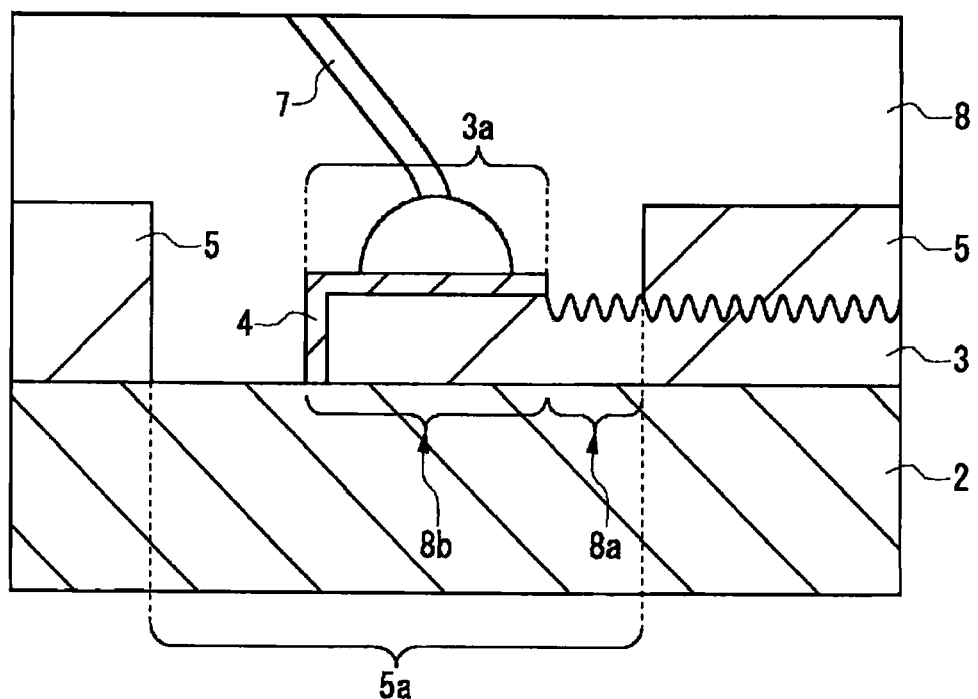
FIG. 2 is an enlarged sectional view of a pad electrode part of the circuit apparatus shown in FIG. 1.

FIG. 1 is a schematic sectional view of a circuit apparatus according to a first embodiment provided with a pad electrode. FIG. 2 is a sectional view showing a pad electrode part (cross section indicated by X in FIG. 1) of the circuit apparatus shown in FIG. 1 on an enlarged scale. A description will be given of the circuit apparatus according to the first embodiment with reference to FIGS. 1 and 2.

The circuit apparatus according to the first embodiment is provided with a metal substrate 1, an insulating layer 2, a wiring layer 3 (pad electrode 3a), a gold plating layer 4, an insulating resin layer 5, a circuit element 6, a conductive member 7 and a sealing resin layer 8.

The metal substrate 1 is implemented by, for example, a copper (Cu) substrate having a thickness of about 1.5 mm. The assembly comprising the metal substrate 1 and the insulating layer 2 is an example of the "substrate" according to the invention.

A film primarily composed of epoxy resin is employed to form the insulating layer 2. The thickness of the layer 2 is about, for example, 80 μm.

It is preferable that the insulating layer 2 be highly heat conductive for improvement in heat dissipation from the circuit apparatus. For this purpose, the insulating layer 2 preferably includes a highly heat conductive filler of, for example, silver, bismuth, copper, aluminum, magnesium, tin, zinc or an alloy thereof. The filler may alternatively comprise silica, alumina, silicon nitride or aluminum nitride.

In the first embodiment, four via holes 2a having a diameter of about 70 μm and running through the insulating layer 2 in the direction of thickness are formed at predetermined intervals in an area in the insulating layer 2 located below the circuit element 6 described later. A member constituting the wiring layer 3 mentioned later is embedded in each of the via holes 2a. The wiring layer 3 is in contact with the top surface of the metal substrate 1 via the via holes 2a. The wiring layer 3 embedded in the via hole 2a has the function of conducting heat from the circuit element 6 to the metal substrate 1 and dissipating the heat.

A metal such as copper or aluminum is employed to form the wiring layer 3. The thickness of the layer 3 is about, for example, 20 μm. The wiring layer 3 includes a pad electrode 3a in a portion thereof and is worked to present a predetermined wiring pattern. A gold plating layer 4 is formed on the surface of the pad electrode 3a of the wiring layer 3. The surface of the wiring layer 3 outside the pad electrode 3a is roughened. The arithmetic average roughness Ra of the wiring layer 3 with the roughened surface is preferably about 0.2 μm-10 μm. A copper wiring with the roughness Ra of about 0.38 μm as a result of the roughening process is employed in the illustrated example. The roughness Ra of the copper wiring prior to the roughening process is about 0.25 μm.

A plating film of electrolytic Au/Ni is used to form the gold plating layer 4. The thickness of the layer is about, for example, 0.5 μm. The gold plating layer 4 is formed to cover a portion of the surface of the wiring layer 3 where the pad electrode 3a is formed. The pad electrode 3a is an example of the electrode of the present invention. The roughness Ra of the gold plating layer 4 is about 0.11 μm. The roughness (arithmetic average roughness Ra) of the surface of the gold plating 4 is smaller than that of the surface of the wiring layer 3 formed of copper, resulting in smaller anchor effect between the layer 4 and the sealing resin layer 8. Therefore, the gold plating layer 4 provides less intimate contact than the copper wiring layer 3.

A solder resist film comprising epoxy resin is employed to form the insulating resin layer 5. The thickness of the layer 5 is about, for example, 30 μm. The insulating resin layer 5 is formed on the assembly comprising the insulating layer 2 and the wiring layer 3 and is provided with an opening 5a corresponding to the area in the wiring layer 3 that includes the pad electrode 3a. The insulating resin layer 5 functions as a protective film for the wiring layer 3. Since the insulating resin layer 5 is formed on the wiring layer 3, the surface of which is roughened, intimate contact occurs at the interface.

The circuit element 6 is, for example, a semiconductor element such as an IC chip or an LSI chip, or a passive element such as a capacitor or a resistor. In this case, an LSI chip provided with a pad electrode (not shown) on its top surface is employed. The circuit element 6 is mounted on a predetermined area on the insulating resin layer 5.

For example, a gold wire is employed to form the conductive member 7 to wire bond between the pad electrode 3a of the wiring layer 3 and the circuit element 6 via the gold plating layer 4 for electrical connection.

The sealing resin layer 8 is formed so as to entirely cover the insulating resin layer 5, the circuit element 6 and the opening 5a in the insulating resin layer 5. At the opening 5a, the sealing resin layer 8 is in contact with the gold plating layer 4, the insulating layer 2 and the wiring layer 3. The sealing resin layer 8 protects the circuit element 6 from conditions external to the apparatus. For example, thermosetting insulating resin such as epoxy resin is used to form the sealing resin layer 8. A filler for enhancing heat conductivity may be added to the sealing resin layer 8.

Figure 3:
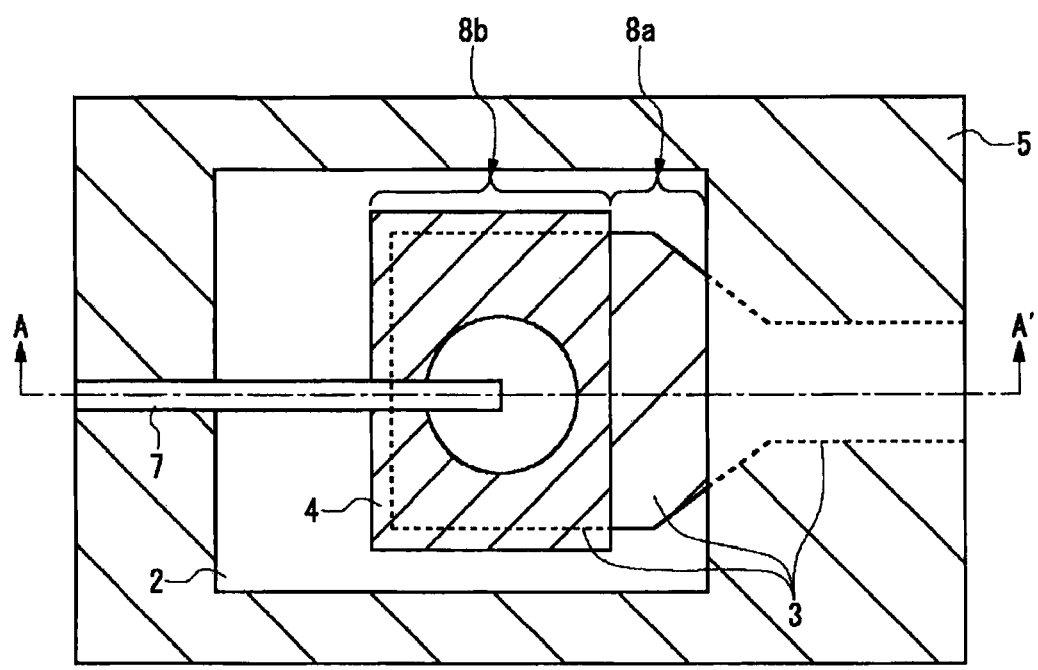
FIG. 3 is an enlarged top view of the pad electrode part of the circuit apparatus shown in FIG. 1.

FIG. 3 is an enlarged top view of the pad electrode part (shown in a cross section indicated by X in FIG. 1) of the circuit apparatus shown in FIG. 1. The surface where the sealing resin layer 8 is contact with the wiring layer 3 (area 8a) is located between an area of connection 8b with the conductive member 7 and the wiring pattern covered by the insulating resin layer 5.

(Method of Fabrication)

First Process for Fabricating the Circuit Apparatus According to the First Embodiment FIGS. 4A through 5D are sectional views illustrating the first process for fabricating the circuit apparatus according to the first embodiment shown in FIG. 1. A description will now be given of the first process for fabricating the circuit apparatus according to the first embodiment with reference to FIGS. 1, 4A-4E and 5A-5D.

Figure 4A:
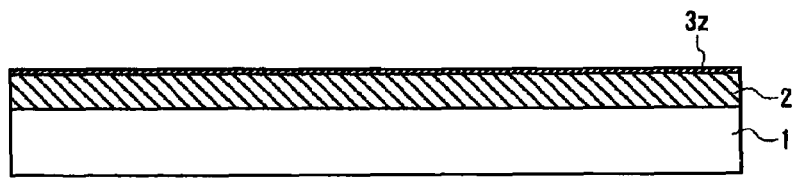
FIGS. 4A-4E are sectional views illustrating the first process for fabricating the circuit apparatus according to the first embodiment.

As shown in FIG. 4A, a stacked film comprising the insulating layer 2 having a thickness of about 80 μm and a copper foil 3z having a thickness of about 3 μm is pressure bonded to the metal substrate 1.

Figure 4B:
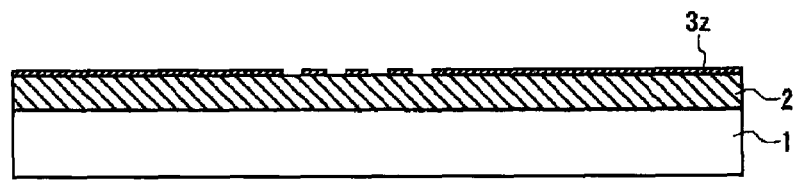

As shown in FIG. 4B, photolithography and etching are used to remove the copper foil 3z located where the via holes 2a (see FIG. 1) are formed. In this way, the area in the insulating layer 2 where the via holes 2a are formed is exposed.

Figure 4C:
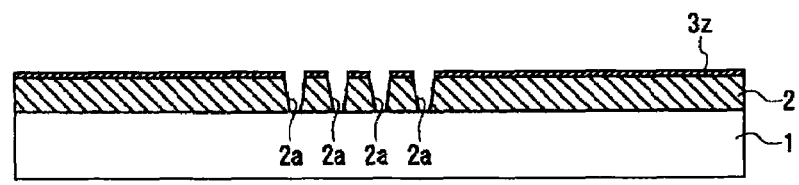

As shown in FIG. 4C, the copper foil 3z is irradiated by $CO_2$ laser or UV laser from above so as to remove an area extending from the exposed surface of the insulating layer 2 to the surface of the metal substrate 1. In this way, the via hole 2a having a diameter of about 70 µm at the surface and running through the insulating layer 2 is formed.

Figure 4D:
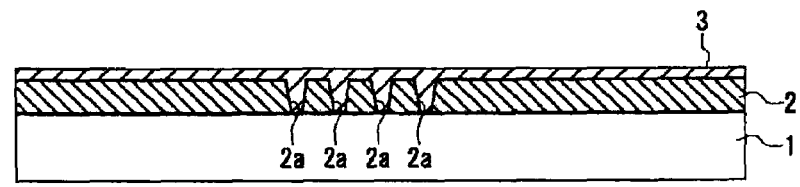

As shown in FIG. 4D, electroless plating is used to plate the surface of the copper foil 3z and the interior of the via hole 2a with copper to a depth of about 0.5 µm. Subsequently, electroplating is used to plate the surface of the copper foil 8z and the interior of the via hole 7a with copper. In this embodiment, an inhibitor and an accelerator are added to the plating solution, so that the inhibitor is absorbed by the surface of the copper foil 3z and the accelerator is absorbed by the interior of the via hole 2a. This can enlarge the thickness of copper plating in the interior of the via hole 2a. Thereby, the via hole 2a is filled with copper. As a result, as shown in FIG. 4D, the wiring layer 8 having a thickness of about 20 µm is formed on the insulating layer 2 and the via hole 2a is filled by the wiring layer 3.

Figure 4E:
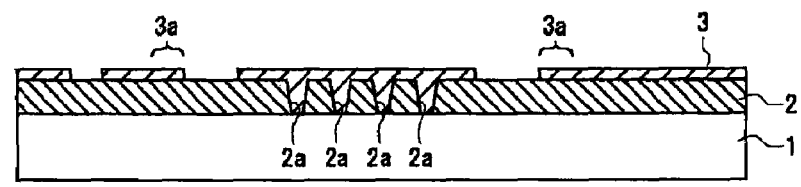

As shown in FIG. 4E, photolithography and etching are used to pattern the wiring layer 3. In this way, the wiring layer 3 having a predetermined wiring pattern (pad electrode 3a etc.) is formed.

Figure 5A:
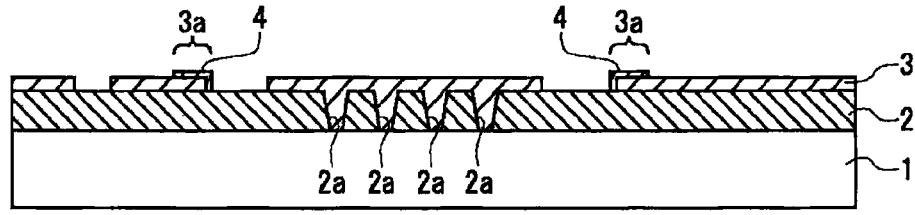
FIGS. 5A-5D are sectional views illustrating the first process for fabricating the circuit apparatus according to the first embodiment.

Subsequently, as shown in FIG. 5A, selective plating is used to form a gold plating layer (electrolytic Au/Ni plating film) on the surface of a predetermined area (area for the pad electrode 3a) of the wiring layer 3. The area where the gold plating layer 4 is formed is as illustrated in FIG. 3 mentioned earlier.

Figure 5B:
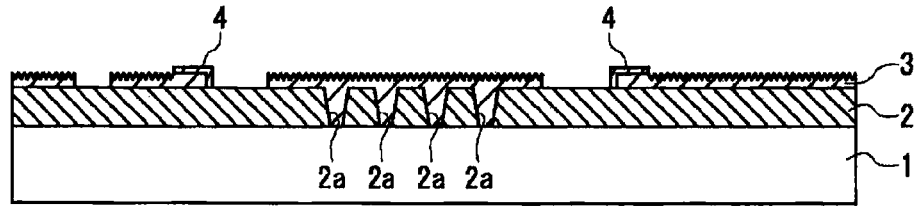

As shown in FIG. 5B, the surface of the wiring layer 3 is roughened by, for example, wet treatment. By using an acid-based chemical to treat the surface, the surface is turned into a roughened surface with minute irregularities. In this way, the surface of the wiring layer 3 is roughened with minute irregularities formed therein. The arithmetic average roughness Ra of the wiring layer 3 with the roughened surface is about 0.38 µm, as mentioned earlier. The surface roughness Ra of the wiring layer 3 can be measured with a surface measuring probe. The wet treatment using an acid-based chemical does not roughen the surface of the gold plating layer 4. The roughness Ra of the gold plating layer 4 is about, for example, 0.11 µm.

Figure 5C:
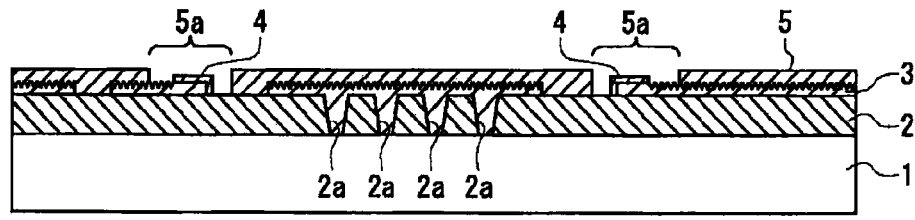

As shown in FIG. 5C, the insulating resin layer 5 is formed so as to cover the insulating layer 2 and the wiring layer 3 and to have an opening 5a corresponding to the area in the wiring layer 3 in which the pad electrode 3a is formed. The thickness of the insulating resin layer 5 is about 30 µm. Since the insulating resin layer 5 is formed on the wiring layer 3, the surface of which is roughened, intimate contact with the insulating resin layer 5 is ensured.

Figure 5D:
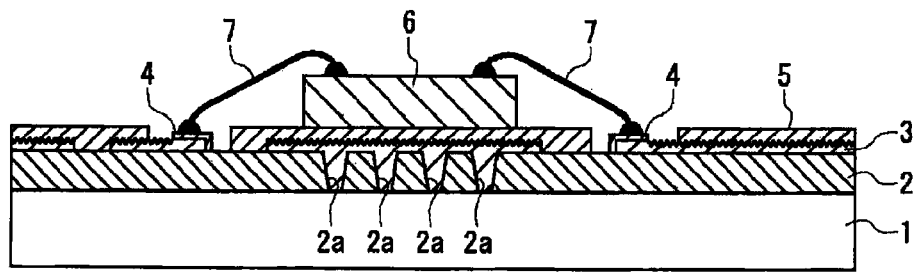

As shown in FIG. 5D, the circuit element 6 is mounted on the insulating resin layer 5. The circuit element 6 is, for example, an LSI chip provided with a pad electrode (not shown) on its top surface. Subsequently, the conductive member 7 is used to wire-bond the pad electrode of the wiring layer 3 to the circuit element 6 via the gold plating layer 4. This establishes electrical connection between the circuit element 6 and the wiring layer 3.

Finally, as shown in FIG. 1, the sealing resin layer 8 is formed on the insulating resin layer 5 so as to cover the circuit element 6 and the opening 5a for the pad electrode 3a. In this process, it is ensured that the sealing resin layer 8 covers the pad electrode 3a such that the layer 8 is in contact with both the gold plating layer 4 and the wiring layer 3. As mentioned earlier, the roughness (arithmetic average roughness Ra) of the surface of the copper wiring layer 3 is larger than that of the gold layer 4. As a result, the anchor effect between the layer 3 and the sealing resin layer 8 is more pronounced than between the gold plating layer 4 and the layer 8.

The circuit apparatus according to the first embodiment is produced through the steps described above.

The following advantages are provided by the circuit apparatus according to the first embodiment.

(1) The sealing resin layer 8 at the pad electrode 3a is not only in contact with the gold plating layer 4 but also in contact with the wiring layer 3, which provides more intimate contact than the gold plating layer 4. Thus, the intimacy of contact with the sealing resin layer 8 at the pad electrode 3a is improved as compared with the case where the layer 8 is only in contact with the gold plating layer. Consequently, the circuit apparatus is less affected by thermal stress and humidity, resulting in improved reliability of the apparatus.

(2) Degradation on the surface of the pad electrode occurring if the wiring layer 3 is formed of copper is minimized since the gold plating layer 4 is provided on the surface of the pad electrode 3a. Therefore, the intimacy of contact between the pad electrode 3a and the sealing resin layer 8 is improved and, further, improper connection between the circuit element 6 and the wiring layer 3 in the circuit apparatus is minimized. As a result, the reliability of the circuit apparatus is further improved.

(3) Since the surface of the wiring layer 3 in contact with the sealing resin layer 8 is roughened, the intimacy of contact at the interface between the wiring layer 3 and the sealing resin layer 8 is further improved so that the likelihood of exfoliation of the sealing resin layer 8 at the pad electrode 3a is effectively reduced.

Second Process for Fabricating the Circuit Apparatus According to the First Embodiment A description will now be given of the second process for fabricating the circuit apparatus according to the first embodiment. A description of those steps that are similar to those of the first fabrication process is omitted as appropriate. The description below highlights those aspects that are different from the corresponding aspects of the first fabrication process. FIGS. 6A-6D and 8A-8B are top views of a pad area, illustrating the second process for fabricating the circuit apparatus according to the first embodiment shown in FIG. 1. FIGS. 7A-7D and 9A-9B are sectional views along A-A' of FIGS. 6A-6D and 8A-8B, respectively. In FIGS. 7A-9B, the essential part of the pad electrode in the circuit apparatus according to the first embodiment is illustrated.

The second fabrication process involves the same steps shown in FIGS. 4A-4E illustrating the first fabrication process.

Figure 6A:
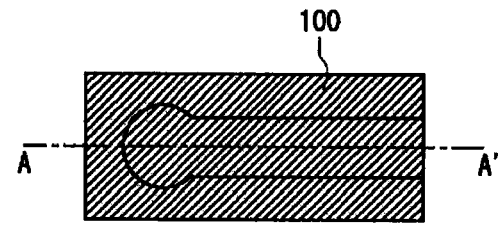
FIGS. 6A-6D are top views of an essential part illustrating the second process for fabricating the circuit apparatus according to the first embodiment.
Figure 7A:
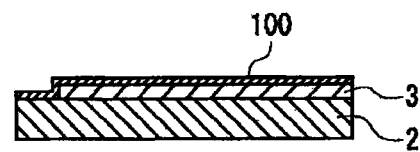
FIGS. 7A-7D are sectional views of an essential part illustrating the second process for fabricating the circuit apparatus according to the first embodiment.

Subsequent to the step shown in FIG. 4E, as shown in FIGS. 6A and 7A, a conductive layer 100 of flash copper is formed on the insulating layer 2 and the wiring layer 3 by electroless plating. The thickness of the conductive layer 100 is, for example, 1 µm. A circular pad area resembling a tip of a matchstick is formed at the end of the wiring layer 3. The pad area may be rectangular in shape instead of circular.

Figure 6B:
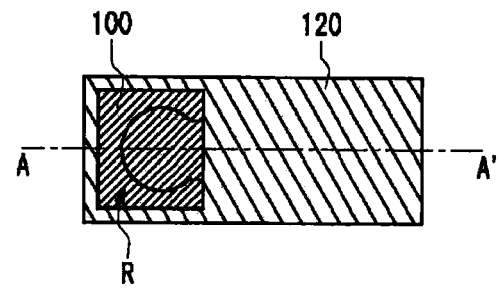
Figure 7B:
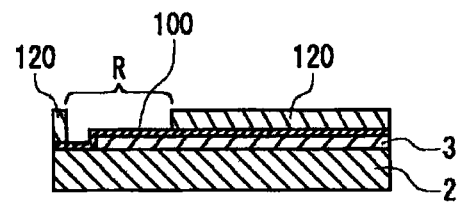

Subsequently, as shown in FIGS. 6B and 7B, a resist 120 resistant to gold is stacked on the conductive layer 100. An opening R is then formed in the pad area by exposing and developing the resist 120. This exposes the conductive layer 100 at the opening R.

Figure 6C:
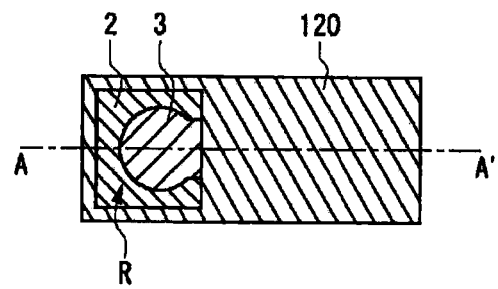
Figure 7C:
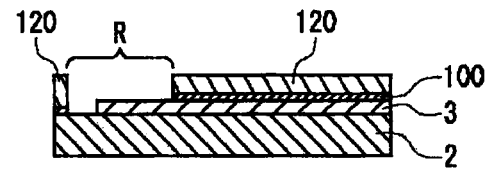

Subsequently, as shown in FIGS. 6C and 7C, the conductive layer 100 inside the opening R is removed by etching the layer 100 by using a mixture of sulfuric acid and hydrogen peroxide. This results in the wiring layer 3 and the surrounding insulating layer 2 being exposed in the opening R.

Figure 6D:
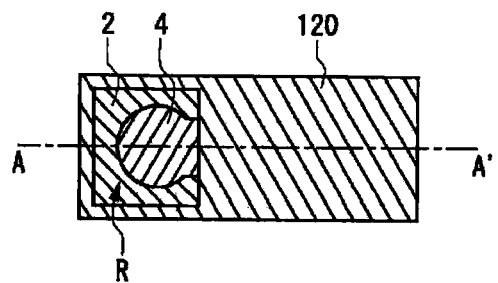
Figure 7D:
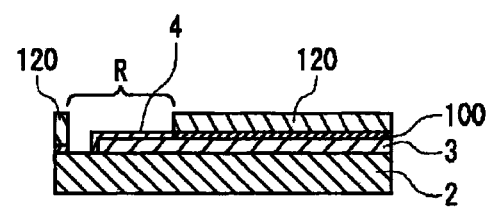

Subsequently, as shown in FIG. 6D and FIG. 7D, the gold plating layer (electrolytic Au/Ni plating film) is formed by electroplating on the wiring layer 3 exposed in the opening R, by using the conductive layer 100 provided beneath the resist 120 as a bus line.

Figure 8A:
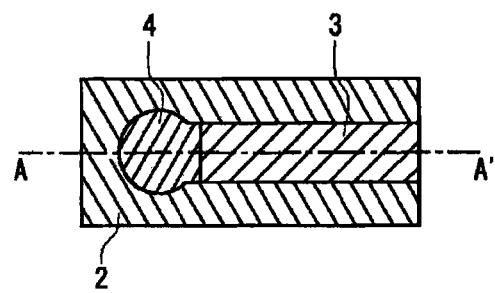
FIGS. 8A-8B are top views of an essential part illustrating the second process for fabricating the circuit apparatus according to the first embodiment.
Figure 9A:
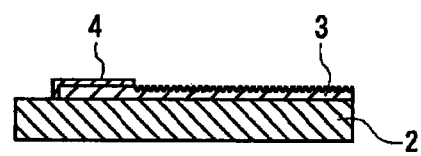
FIGS. 9A-9B are sectional views of an essential part illustrating the second process for fabricating the circuit apparatus according to the first embodiment.

Subsequently, as shown in FIGS. 8A and 9A, the resist 120 is removed and a mixture of sulfuric acid and hydrogen peroxide is used to remove the conductive layer 100 by etching. Etching also roughens the surface of the wiring layer 3 as explained in the first fabrication process.

Figure 8B:
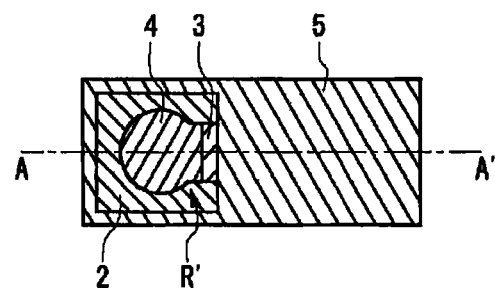
Figure 9B:
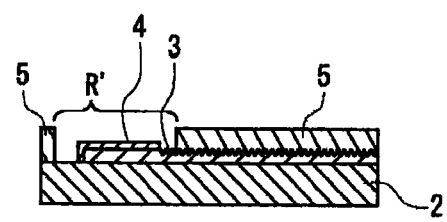

Subsequently, as shown in FIGS. 8B and 9B, the insulating resin layer (photosolder resist) 5 is stacked upon the assembly. An opening R' is formed in the pad area by exposing and developing the layer 5. The opening R' is larger than the opening R to ensure that a part of the wiring layer 3 not covered by the gold plating layer 4 is exposed. This ensures that the gold plating layer 4 and the area of the wiring layer 3, which is in adjacent to the gold plating layer 4 and is roughened, are exposed. Since the underside of the insulating resin layer 5 is in contact with the wiring layer 3 which is roughened, intimacy of contact between the wiring layer 3 and the insulating resin layer 5 is improved due to the anchor effect.

The structure corresponding to that of FIG. 5C of the first fabrication process is obtained through the steps described above. By performing the similar steps as in the first fabrication process subsequently, the circuit apparatus according to the first embodiment is fabricated.

The following advantages are provided by the circuit apparatus according to the second fabrication process.

(4) For formation of the gold plating layer 4 in the pad area by selective plating, a bus line for plating connected to the pad area should be formed. Dicing into individual pieces results in the bus line for plating being severed. However, part of the bus line leading from the dicing line to the pad area remains. The remaining bus line may generate noise by operating as an antenna. According to the second fabrication process, however, the conductive layer 100 of flash copper formed on the wiring layer 3 is used as a bus line, and the conductive layer 100 is removed after the gold plating layer 4 is formed. Therefore, it is ensured that the bus line for plating does not represent a source of noise.

(5) For formation of the gold plating layer 4 in the pad area by selective plating, a bus line for plating connected to the pad area should be formed. This may impose constraints on the layout of wiring etc. and prevent components from being mounted with high density. Whereas, according to the second fabrication process, the conductive layer 100 for plating is removed after the gold plating layer 4 is formed. Accordingly, there are less constraints on the layout of wiring etc, and attempts for high density of components are likely to be successful.

Second Embodiment

Figure 10:
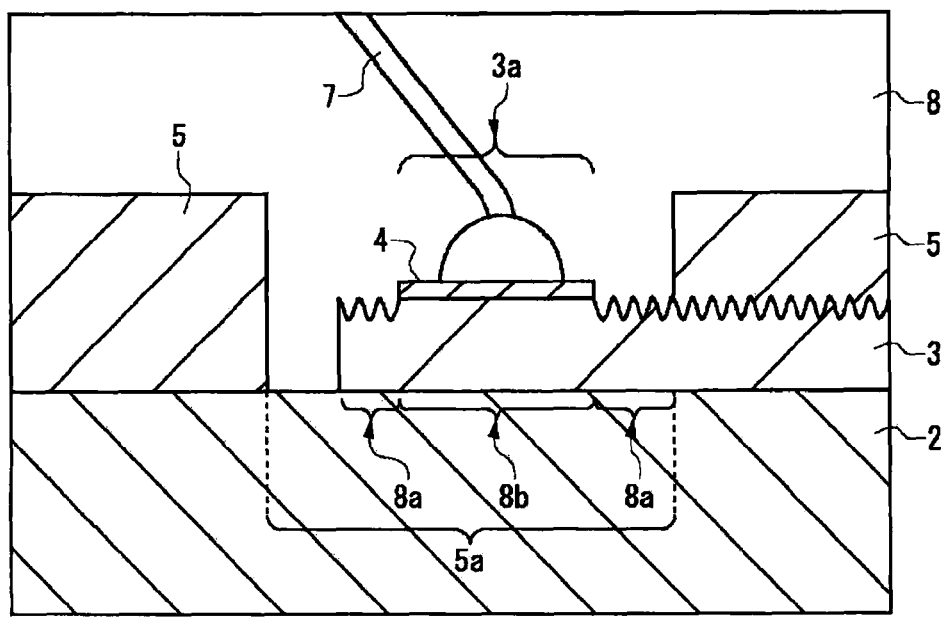
FIG. 10 is a sectional view showing the schematic sectional structure of a circuit apparatus according to a second embodiment of the present invention.
Figure 11:
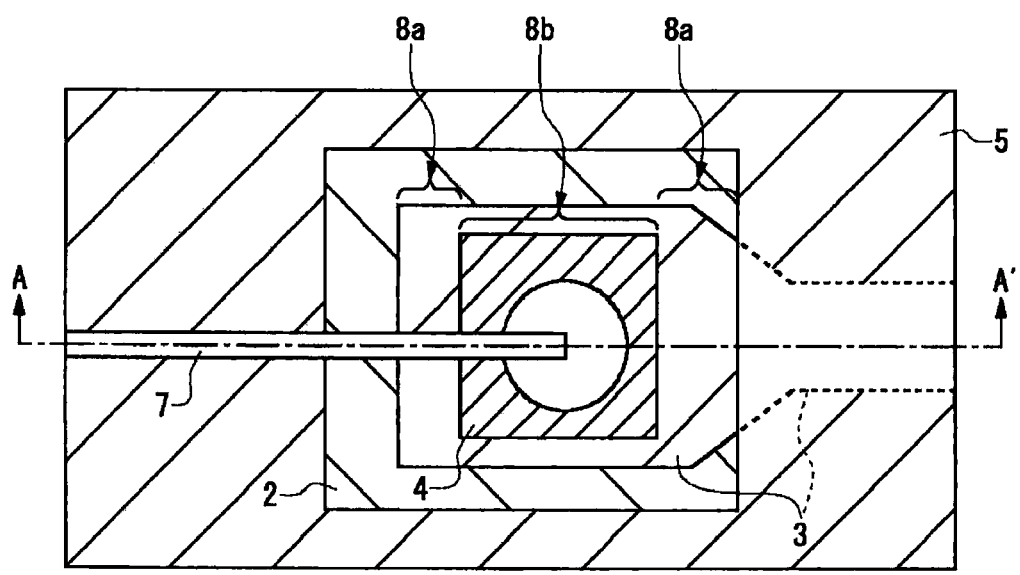
FIG. 11 is an enlarged sectional view of a pad electrode part of the circuit apparatus shown in FIG. 6.

FIG. 10 is a sectional view of a pad electrode part of a circuit apparatus according to a second embodiment of the present invention. FIG. 11 is a top view of the pad electrode part of the circuit apparatus shown in FIG. 10. The circuit apparatus according to the second embodiment differs from that of the first embodiment in that the area 8a where the sealing resin layer 8 is in contact with the wiring layer 3 is provided around the area for connection 8b in contact with the gold plating layer 4. The other aspects of the second embodiment are the same as the corresponding aspects of the first embodiment.

The following advantage is provided by the circuit apparatus according to the second embodiment.

(6) Since the gold plating layer 4 is surrounded by the wiring layer 3 which is roughened, the likelihood of exfoliation of the sealing resin layer B from the pad electrode 3a is effectively reduced. As a result, the circuit apparatus with improved reliability is provided.

Third Embodiment

Figure 12:
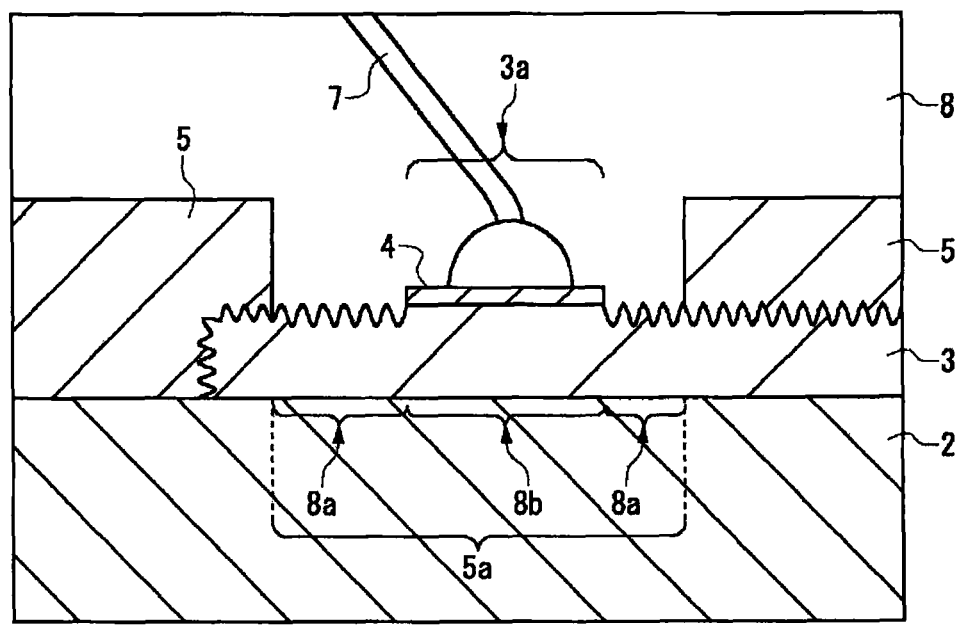
FIG. 12 is a sectional view showing the schematic sectional structure of a circuit apparatus according to a third embodiment of the present invention.
Figure 13:
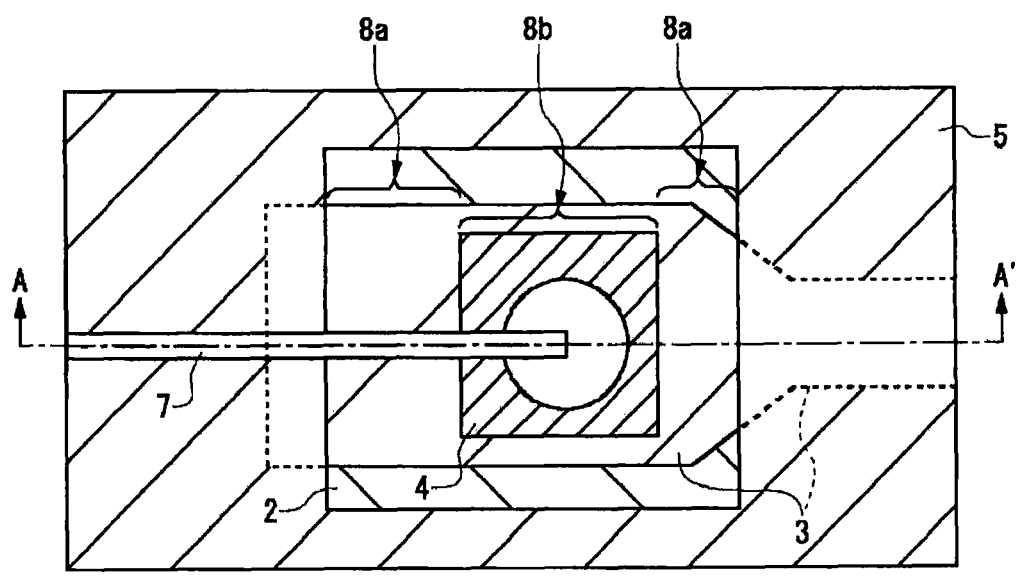
FIG. 13 is an enlarged sectional view of a pad electrode part of the circuit apparatus shown in FIG. 12.

FIG. 12 is a sectional view of a pad electrode part of a circuit apparatus according to a third embodiment of the present invention. FIG. 13 is a top view of the pad electrode part of the circuit apparatus shown in FIG. 12. The circuit apparatus according to the third embodiment differs from that of the first embodiment in that the area 8a where the sealing resin layer 8 is in contact with the wiring layer 3 is provided around the area for connection 8b in contact with the gold plating layer 4 and that the end of the wiring layer 3 covers the insulating layer 2 between the insulating resin layer 5 and the gold plating layer 4. The other aspects of the third embodiment are the same as the corresponding aspects of the first embodiment.

The following advantage is provided by the circuit apparatus according to the second embodiment.

(7) Since the gold plating layer 4 is surrounded by the large area of the wiring layer 3 which is roughened, the likelihood of exfoliation of the pad electrode 3a from the sealing resin layer 8 is effectively reduced. As a result, the circuit apparatus with improved reliability is provided.

Fourth Embodiment

In the aforementioned embodiments, the circuit element 6 and the pad electrode of the wiring layer 3 are wire bonded via the gold plating layer 4. Alternatively, the surface of the circuit element 6 where the electrode is formed may face the pad electrode of the wiring layer 3 so that the circuit element 6 is flip chip connected by using a solder etc. As mentioned before, the circuit element 6 may be a passive element such as a resistor or a capacitor. Further, while a two-layer build-up substrate is used by way of example to build the wiring layer, other configurations are also possible.

Figure 14:
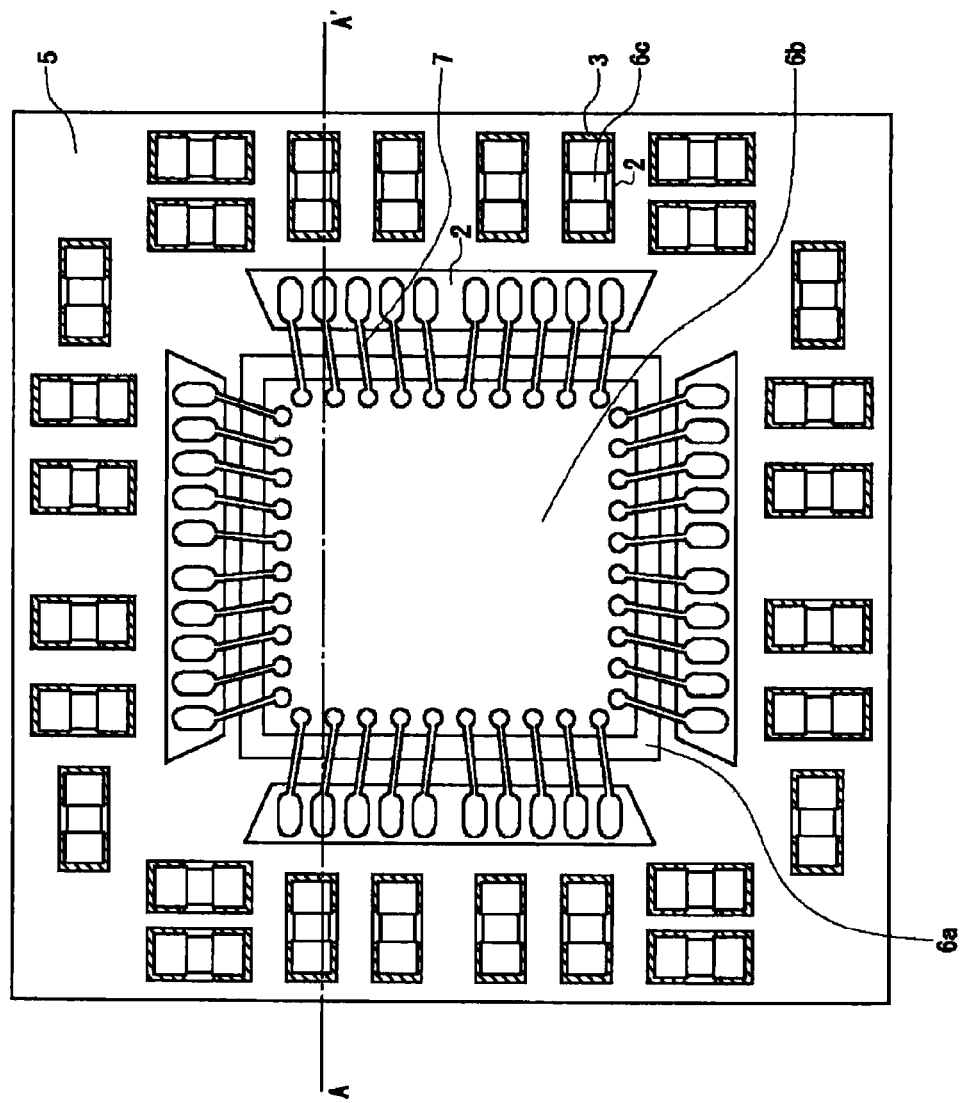
FIG. 14 is a top view showing the structure of a circuit apparatus according to a fourth embodiment.
Figure 15:
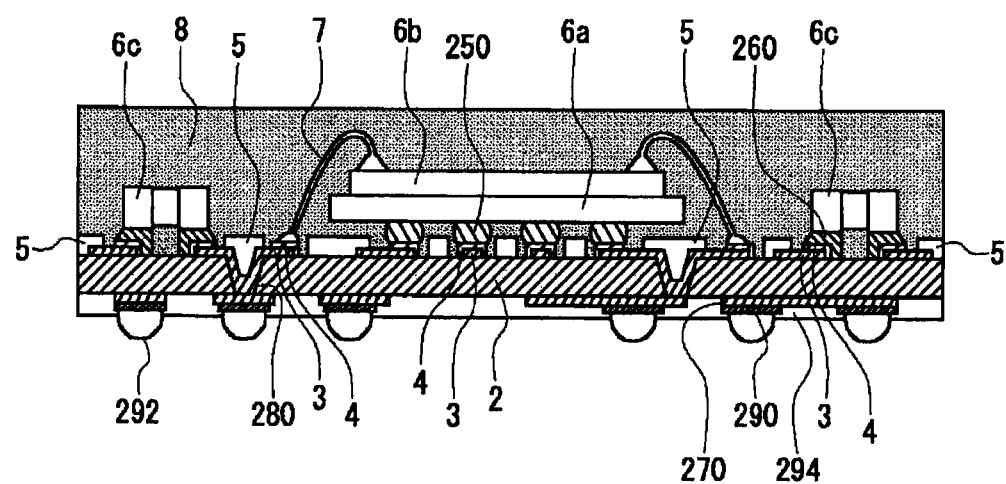
FIG. 15 is a sectional view along A-A' of FIG. 14.
Figure 16:
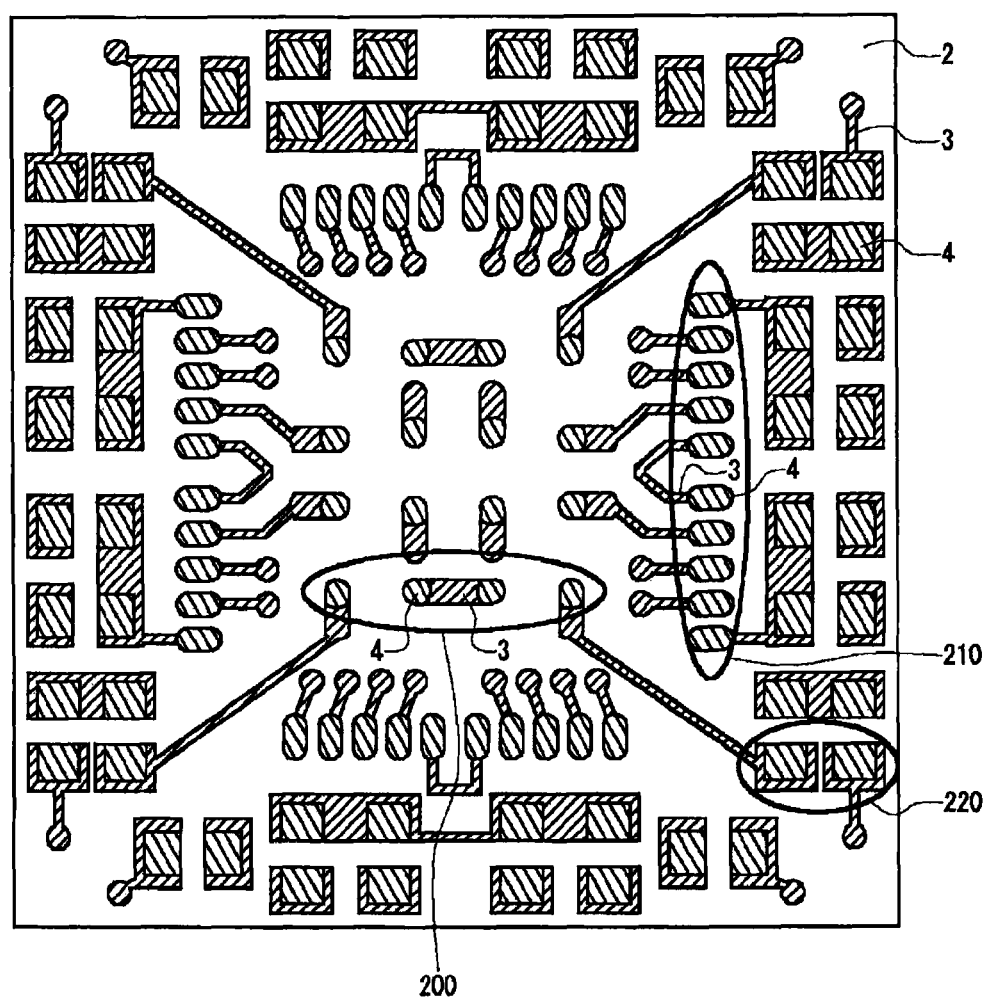
FIG. 16 shows a pattern of a wiring layer and a gold plating layer of the circuit apparatus according to the fourth embodiment.
Figure 17:
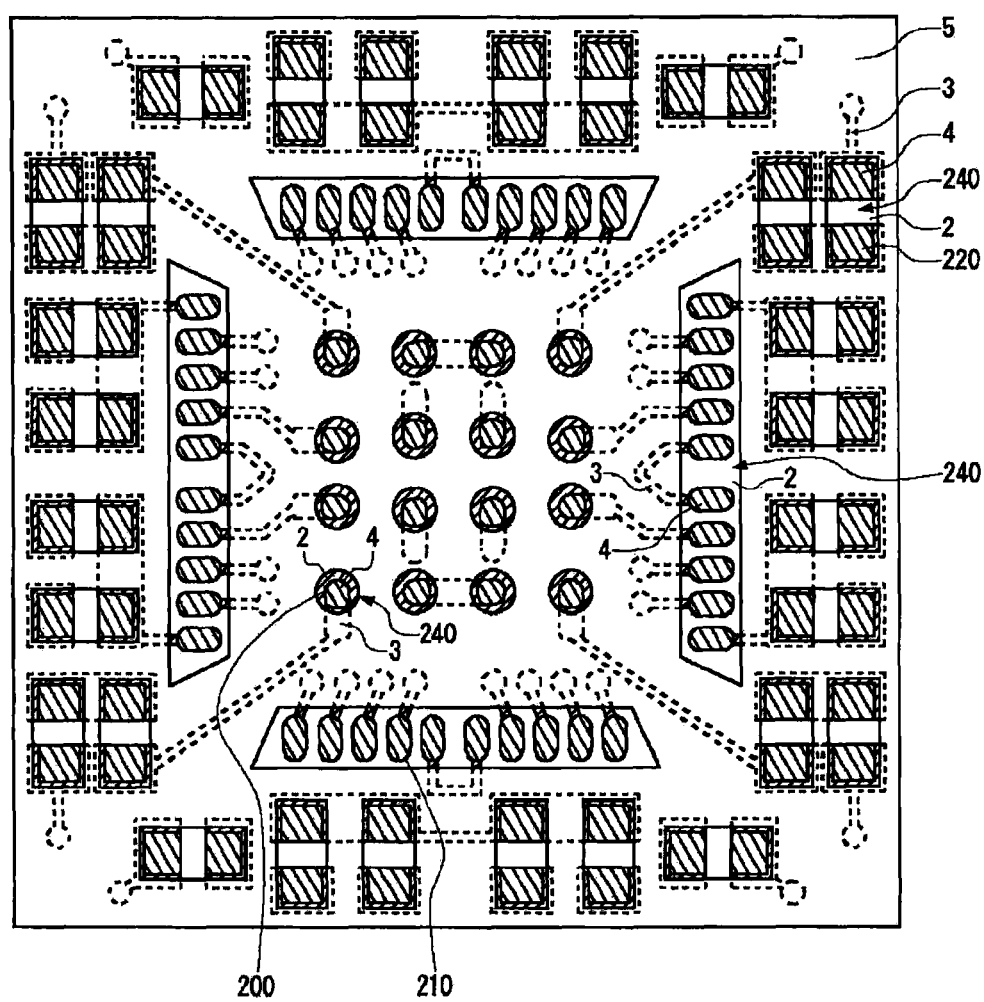
FIG. 17 shows a pattern of openings in the insulating layer of the circuit apparatus according to the fourth embodiment.
Figure 18:
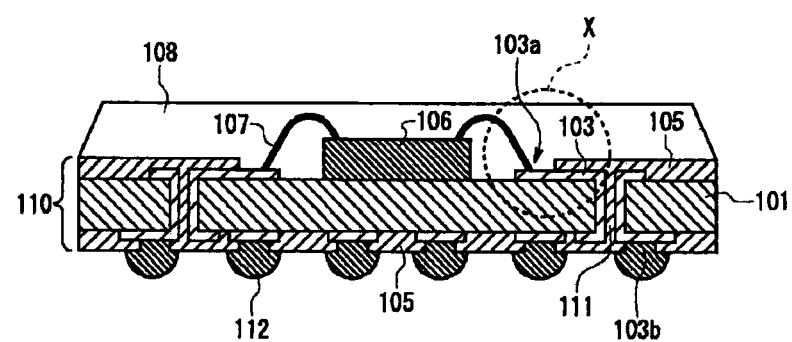
FIG. 18 is a sectional view showing the schematic sectional structure of a semiconductor apparatus of a BGA type according to the related art.
Figure 19:
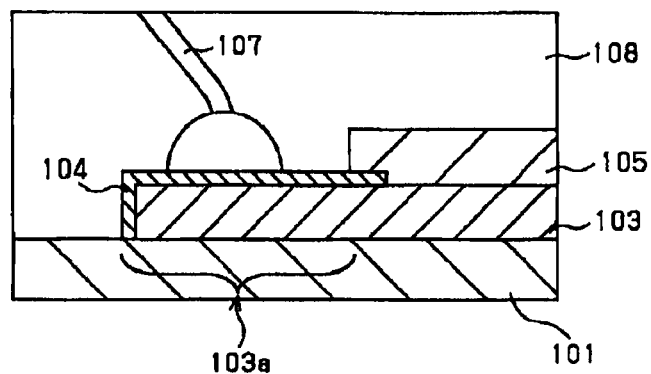
FIG. 19 is an enlarged sectional view of a pad electrode part of the semiconductor apparatus shown in FIG. 18.

FIG. 14 is a top view showing the structure of a circuit apparatus according to a fourth embodiment. In FIG. 14, the sealing resin layer is omitted from the illustration. FIG. 15 is a sectional view along A-A' of FIG. 14. FIG. 16 shows a pattern of a wiring layer and a gold plating layer of the circuit apparatus according to the fourth embodiment. FIG. 17 shows a pattern of openings in the insulating layer of the circuit apparatus according to the fourth embodiment; In FIG. 17, portions not visible behind the insulating layer are indicated by dotted lines.

The circuit apparatus according to the fourth embodiment includes circuit elements 6a and 6b such as LSIs, and a circuit element 6c such as a resistor or a capacitor. As shown in FIG. 16, the wiring layer 3 is patterned on the insulating layer 2. Flip chip pads 200 having the gold plating layer 4 are provided for flip chip connection at the center of the circuit apparatus. Wire bonding pads 210 having the gold plating layer 4 are provided for wire bonding around the flip chip pads 200. Passive element pads 220 having the gold plating layer 4 are provided for mounting the circuit element 6c around the wire bonding pads 210. The detailed structure around the flip chip pads 200, the wire bonding pads 210 and the passive element pads 220 may be as shown in any of the first through third embodiments.

As shown in FIG. 17, openings 240 are provided in the insulating layer 5 such that the flip chip pads 200, the wire bonding pads 210, the passive element pads 220 and the surrounding areas of the wiring layer 3 are exposed.

Referring back to FIGS. 14 and 15, the circuit element 6a of the circuit apparatus according to the fourth embodiment is flip chip connected to the gold plating layer 4 for the flip chip pad via a solder bump 250. The circuit element 6b is mounted on the circuit element 6a and is wire bonded to the gold plating layer 4 for the wire bonding pad via the conductive member 7 such as a gold wire. The circuit element 6c such as a resistor or a capacitor is mounted via a solder 260 on the gold plating layer 4, for the passive element pad, provided around the circuit element 6a and the circuit element 6b.

A wiring layer 270 having a predetermined pattern is provided on the underside of the insulating layer 2. The wiring layer 270 is electrically connected to the wiring layer 3 via a via 280. A gold plating layer (electrolytic Au/Ni plating film) 290 is formed in the area of the wiring layer 270 where the electrode is formed. A solder bump 292 is formed in the gold plating layer 290. An insulating resin layer (photosolder resist) 294 is formed on the underside of the insulating layer 2 and the wiring layer 270 so that the solder bump 292 is exposed.

The following advantages are provided by the circuit apparatus according to the fourth embodiment.

(8) The advantages (1)-(3) mentioned above are enjoyed in the pad electrode for flip chip connection, the pad electrode for wire bonding and the pad electrode for a passive element.

(9) As a consequence of the above-mentioned advantages, the reliability of the circuit apparatus is improved in a multi-chip module in which circuit elements such as LSIs are stacked.

In the first through third embodiments, the metal substrate having the wiring layer 3 of a single-layer structure is described by way of example. Alternatively, the present invention is applicable to a wiring layer with a multiple layer structure where the pad electrode is provided on the uppermost layer. For example, a package structure called ISB (Integrated System Board: registered trademark) may be used in the aforementioned embodiments. An ISB package is a coreless system in package, a type of electronic circuit packaging mainly comprising bare semiconductor chips, which has a copper wiring pattern but does not use a core (substrate) for supporting circuit components. The four-layer ISB structure as disclosed in JP 2002-110717 may suitably be used in the aforementioned embodiments.

In the embodiments, roughening by wet treatment is described by way of example. Alternatively, the surface of the wiring layer 3 may be roughened by, for example, plasma treatment. In this case, by treating the surface by plasma irradiation using argon gas, the surface is turned into a roughened surface with minute irregularities. The plasma treatment does not roughen the surface of the gold plating layer 4.

In the embodiments, the surface of the wiring layer 3, the insulating layer 2 and the insulating resin layer 5 in contact with the sealing resin layer 8 may be plasma treated. With this, the entirety of the underside of the sealing resin layer 8 is in contact with the plasma treated surface. Therefore, the area where the anchor effect is exhibited is increased and the intimacy of contact with the sealing resin layer 8 is further improved.

What is claimed is:

1. A method for fabricating a circuit apparatus, comprising:
   forming a wiring layer on the primary surface of a wiring substrate;
   forming a conductive layer on the entirety of the primary surface of the wiring substrate;
   forming a first insulating layer on the entirety of the primary surface of the wiring substrate, the first insulating layer having an opening larger than an electrode in an area where the electrode is formed;
   removing the conductive layer exposed in the opening so as to expose the wiring layer;
   forming a gold plating layer on the exposed wiring layer by using the conductive layer as a wire for plating;
   removing the first insulating layer and the conductive layer;
   forming a second insulating layer on the entirety of the primary surface of the wiring substrate, the second insulating layer having an opening through which the gold plating layer and the adjacent wiring layer are exposed; and
   electrically connecting a circuit element to the gold plating layer.

2. The method for fabricating the circuit apparatus according to claim 1, wherein the surface of the exposed wiring layer is roughened in the removing of the first insulating layer and the conductive layer.

\* \* \* \* \*